(12) United States Patent
Tsuchida et al.

(10) Patent No.: US 8,299,348 B2
(45) Date of Patent: Oct. 30, 2012

(54) THERMOELECTRIC MODULE AND METHOD FOR MANUFACTURING THE SAME

(75) Inventors: Nobuyuki Tsuchida, Kokubu (JP); Kenichi Tajima, Kokubu (JP)

(73) Assignee: KYOCERA Corporation, Kyoto (JP)

( * ) Notice: Subject to any disclaimer, the term of this patent is extended or adjusted under 35 U.S.C. 154(b) by 743 days.

(21) Appl. No.: 12/360,494

(22) Filed: Jan. 27, 2009

(65) Prior Publication Data

US 2010/0018222 A1    Jan. 28, 2010

(30) Foreign Application Priority Data

Jan. 29, 2008 (JP) ................. 2008-018209
Feb. 26, 2008 (JP) ................. 2008-044114
Mar. 25, 2008 (JP) ................. 2008-076948
Jan. 9, 2009 (JP) ................. 2009-003067

(51) Int. Cl.
*H01L 35/00* (2006.01)
*H01L 35/30* (2006.01)
*H01L 35/28* (2006.01)
*H01L 37/00* (2006.01)

(52) U.S. Cl. ........ 136/230; 136/200; 136/205; 136/212; 136/229

(58) Field of Classification Search .......... 136/211–212, 136/229
See application file for complete search history.

(56) References Cited

U.S. PATENT DOCUMENTS

| | | | |
|---|---|---|---|
| 4,854,730 A * | 8/1989 | Fraden | 374/164 |
| 5,594,609 A * | 1/1997 | Lin | 361/104 |
| 6,084,172 A * | 7/2000 | Kishi et al. | 136/200 |
| 6,248,978 B1 * | 6/2001 | Okuda | 219/216 |
| 6,274,803 B1 * | 8/2001 | Yoshioka et al. | 136/201 |
| 6,521,991 B1 * | 2/2003 | Yamada et al. | 257/712 |
| 2005/0266596 A1 * | 12/2005 | Matsushima et al. | 438/33 |
| 2006/0289051 A1 * | 12/2006 | Niimi et al. | 136/203 |
| 2007/0227158 A1 * | 10/2007 | Kuchimachi | 62/3.7 |
| 2008/0087316 A1 * | 4/2008 | Inaba et al. | 136/204 |
| 2009/0025770 A1 * | 1/2009 | Lofy | 136/201 |

FOREIGN PATENT DOCUMENTS

| | | |
|---|---|---|
| JP | 1990-170582 | 2/1990 |
| JP | 1993-243621 | 9/1993 |

* cited by examiner

*Primary Examiner* — Jennifer Michener
*Assistant Examiner* — Christopher Danicic
(74) *Attorney, Agent, or Firm* — Procopio, Cory, Hargreaves & Savitch LLP (57) ABSTRACT

Disclosed is a thermoelectric module, including: a first substrate; a plurality of thermoelectric elements arranged on a first surface of the first substrate; and a temperature detector disposed on the first surface or a second surface of the first substrate via a thermal transfer member.

16 Claims, 11 Drawing Sheets

THERMOELECTRIC MODULE AND METHOD FOR MANUFACTURING THE SAME

RELATED APPLICATION

The present application claims priority under 35 U.S.C. §119 to Japanese Patent Application No. 2008-018209, filed Jan. 29, 2008, Japanese Patent Application No. 2008-044114 filed Feb. 26, 2008, Japanese Patent Application No. 2008-076948 filed Mar. 25, 2008, and Japanese Patent Application No. 2009-003067 filed Jan. 9, 2009, and the contents of each of these applications are incorporated herein by reference in their entirety.

BACKGROUND

1. Field of the Invention

The present invention relates to a thermoelectric module. More particularly, the present invention relates to a thermoelectric module used to control a temperature of, for example, an air conditioner, a cooling/warming device, semiconductor production equipment, a photo-detection device, and a laser diode.

2. Related Art

A thermoelectric module which uses the Peltier effect is used as a temperature control module because one end of the thermoelectric module generates heat and the other end of the thermoelectric module absorbs heat when an electric current is passed through the module. To detect the temperature of this thermoelectric module and the temperature of a member whose temperature is controlled by the thermoelectric module, a temperature detector such as a chip thermistor may be mounted on a substrate of the thermoelectric module (for example, refer to Japanese Patent Application Laid-Open No. 05-243621).

In recent years, a high precision temperature control is required for the thermoelectric module as mentioned above. Therefore, further improvement of temperature detection accuracy is required.

SUMMARY

In one embodiment, a thermoelectric module includes: a first substrate; a plurality of thermoelectric elements arranged on a first surface of the first substrate; and a temperature detector disposed on the first surface or a second surface of the first substrate via a thermal transfer member.

BRIEF DESCRIPTION OF THE DRAWINGS

The present disclosure, in accordance with one or more embodiments, is described in detail with reference to the following figures. The drawings are provided for purposes of illustration only and merely depict typical or exemplary embodiments of the disclosure. These drawings are provided to facilitate the reader's understanding of the disclosure and shall not be considered limiting of the breadth, scope, or applicability of the disclosure. It should be noted that for clarity and ease of illustration these drawings are not necessarily made to scale.

DETAILED DESCRIPTION

In the following description of exemplary embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the present invention.

Figure 1:
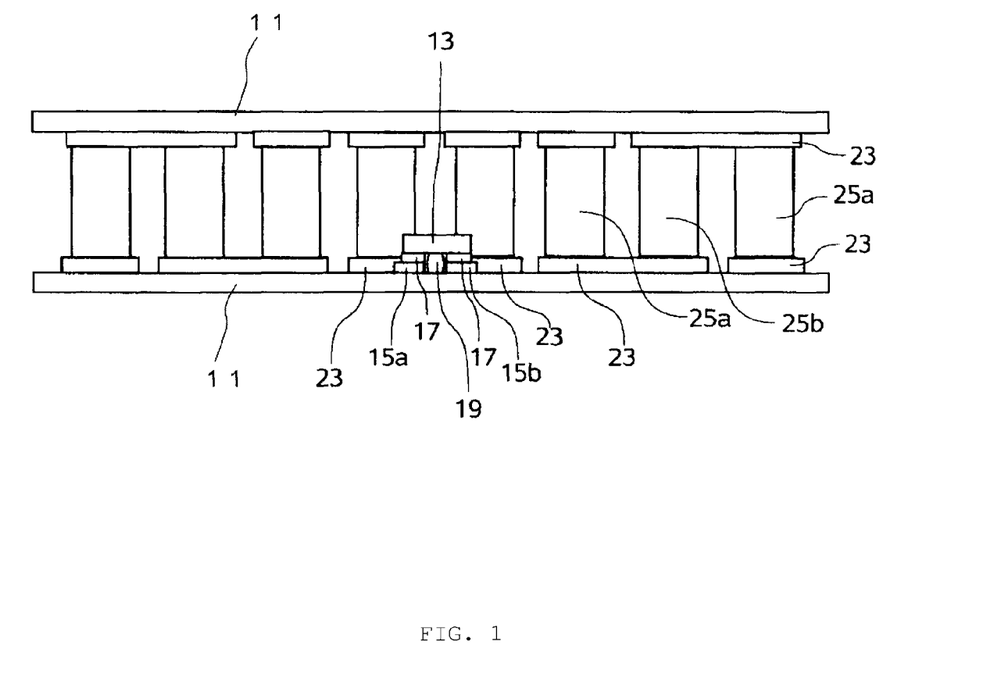
FIG. 1 is a side view showing a first embodiment of a thermoelectric module.
Figure 2:
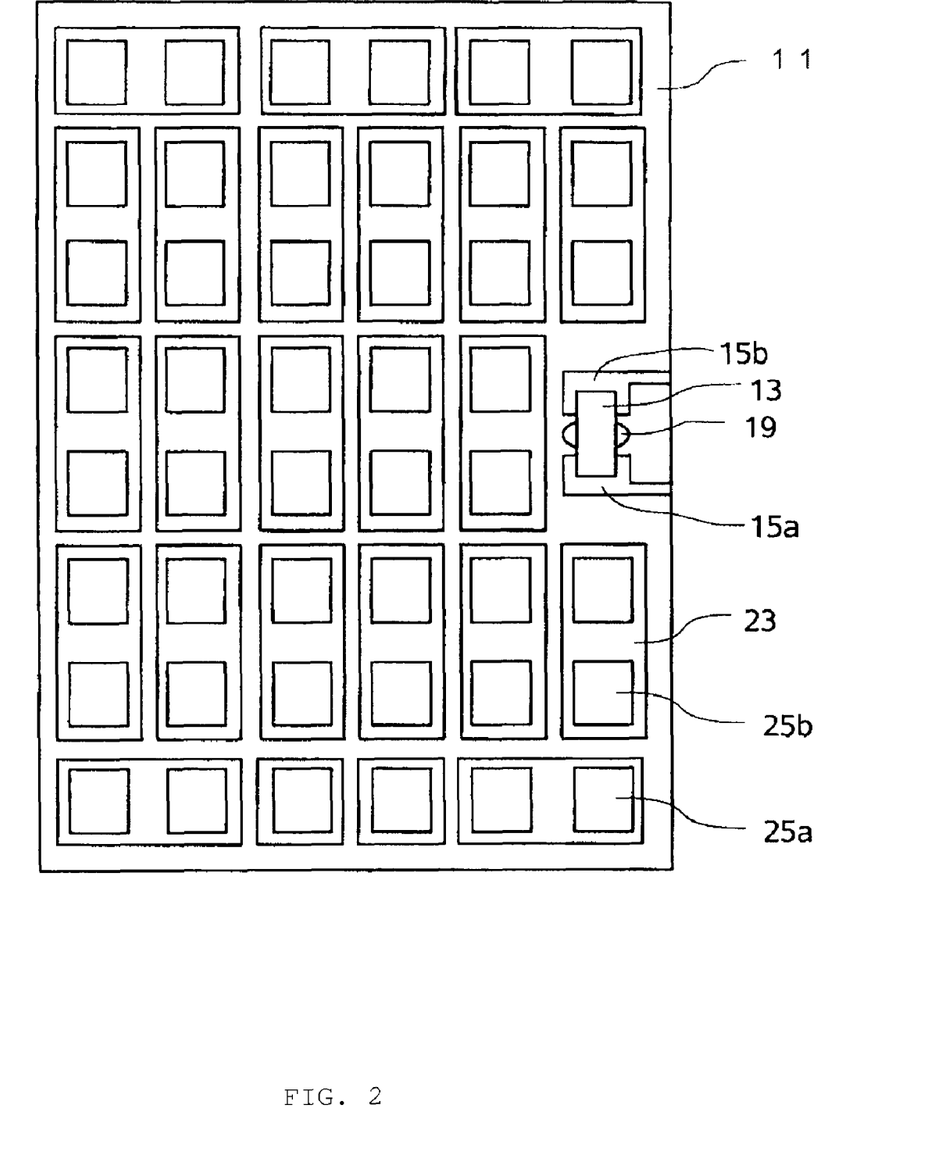
FIG. 2 is a plan view showing the thermoelectric module of FIG. 1 after one of the two substrates is removed.
Figure 3:
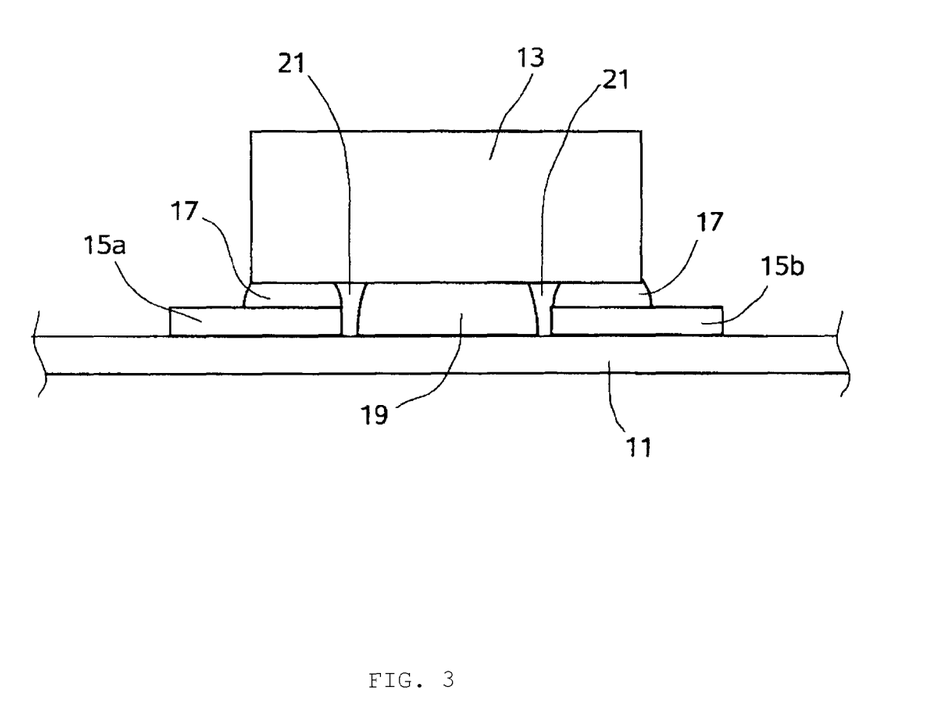
FIG. 3 is an enlarged side view showing an area near a temperature detector in the thermoelectric module shown in FIG. 1.

FIGS. 1 to 3 show a first embodiment of a thermoelectric module.

As shown in FIGS. 1 and 2, the thermoelectric module of the first embodiment includes a pair of substrates 11 arranged facing each other, a plurality of P-type thermoelectric elements 25a and a plurality of N-type thermoelectric elements 25b aligned between two main surfaces facing each other in the pair of substrates 11, and a plurality of electrodes 23 aligned on the substrates 11 in order to connect in series the P-type thermoelectric elements 25a and the N-type thermoelectric elements 25b. This thermoelectric module includes a chip thermistor 13 bonded to the main surface of the substrate 11 by solder 17 via electrodes 15a and 15b.

As shown in FIGS. 2 and 3, between the main surface of the substrate 11 and a bottom surface of the chip thermistor 13, a thermal transfer member 19 which contacts both of these surfaces is placed. Therefore, since a temperature of the substrate 11 is transferred to the chip thermistor 13 more easily compared with a conventional thermoelectric module which has a gap between the chip thermistor and the substrate, a thermal conductivity of the thermoelectric module of this embodiment improves. As a result, it becomes possible to perform high precision temperature control.

In one embodiment, to improve temperature sensitivity of the substrate 11, an area of a thermal transfer member 19 surface which contacts the substrate 11 is larger than an area of another thermal transfer member 19 surface which contacts the chip thermistor 13. Otherwise, the area of the thermal transfer member 19 surface which contacts the substrate 11 can be nearly equal to the area of another thermal transfer member 19 surface which contacts the chip thermistor 13. In that case, thermal conductivity from the substrate 11 to the chip thermistor 13 is further improved.

In addition, the surface of the thermal transfer member 19 is smooth in one embodiment. In this case, since a thermal conducting route on the surface of the thermal transfer member 19 becomes short, the thermal conductivity of the thermal transfer member 19 improves. In addition, since the surface area of the thermal transfer member 19 becomes small, heat radiated from the surface of the thermal transfer member 19 decreases and the thermal conductivity of the thermal transfer member 19 improves.

In addition, the form of the thermal transfer member 19 may be truncated-cone-shaped or cylinder-shaped. In that case, heat distribution unevenness becomes small, and also the surface area becomes small. Therefore the thermal conductivity improves.

When the thermal transfer member 19 has an electrical conductivity, gaps 21 may be provided between the electrodes 15a, 15b along with the solder 17 and the thermal transfer member 19. Since the thermal transfer member 19 is placed to be apart from the solder 17 via the gaps 21, the risk of an electrical short circuit between the electrode 15a and the electrode 15b can be prevented or reduced.

In this case, there can be an insulating material including a resin, ceramics, etc. in the gaps 21, so that the risk of electrical short circuit between the electrode 15a and the electrode 15b can be more securely reduced or prevented. In addition, since the temperature of the substrate 11 can be more easily transferred to the chip thermistor 13 because of the existence of the insulating material, the thermal conductivity increases further. In order to increase insulation performance of the insulating material, the insulating material may include a lot of holes which include air whose electric permittivity is about 1.

When the thermal transfer member 19 includes an electrical conductive material, the electrical conductive material is an electrical conductive resin adhesive in which metal particles are dispersed, or the like.

Figure 4:
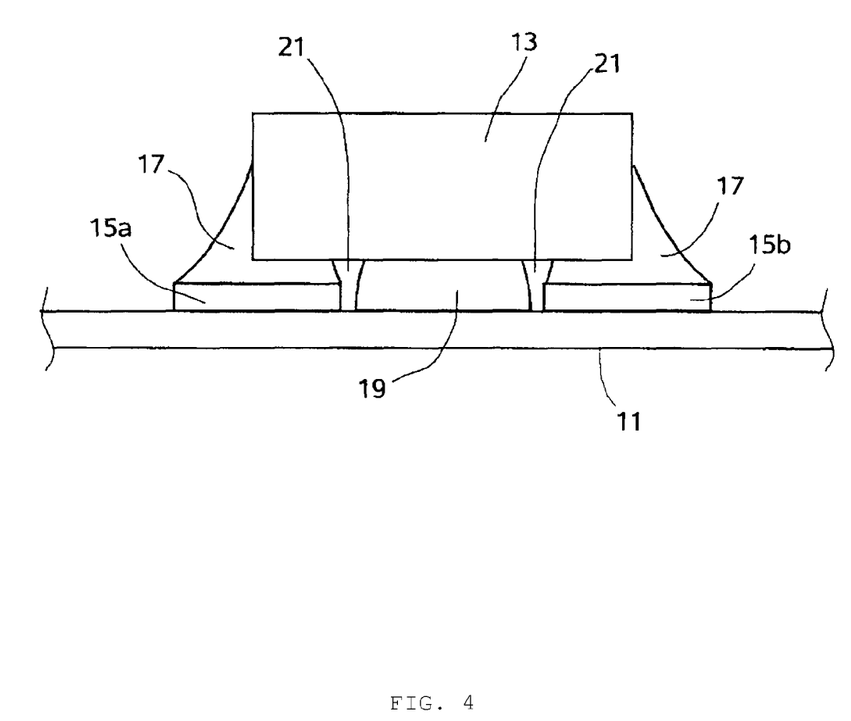
FIG. 4 is an enlarged side view showing an area near a temperature detector in a thermoelectric module in accordance with a second embodiment.

FIG. 4 shows a second embodiment of a thermoelectric module.

In this embodiment, items different from those of the above mentioned first embodiment will be described in detail. Regarding the same constituent elements as those of the first embodiment, redundant explanations are omitted, and like reference numerals are used for like elements.

In the thermoelectric module of this embodiment, the solder 17 is provided not only on the bottom surface of the chip thermistor 13 but also on the side surfaces. This increases bonding strength between the electrodes 15a, 15b and the solder 17.

Figure 5:
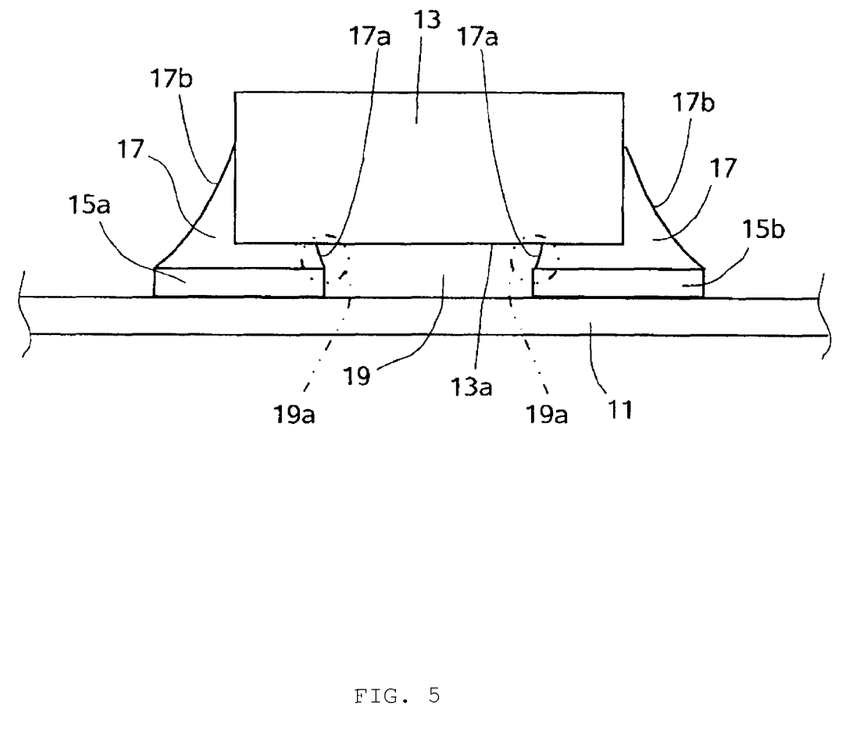
FIG. 5 is an enlarged side view showing an area near a temperature detector in a thermoelectric module in accordance with a third embodiment.

FIG. 5 shows a third embodiment of a thermoelectric module.

In this embodiment, items different from those of the above mentioned first embodiment are described in detail. Regarding the same constituent elements as those of the first embodiment, redundant explanations are omitted, and like reference numerals are used for like elements.

In the thermoelectric module of this embodiment, the thermal transfer member 19 is filled between the substrate 11 and the chip thermistor 13 without any gap. This increases thermal conductivity, and also suppresses rusting of the surfaces of the electrodes 15a, 15b, the solder 17, and the chip thermistor 13. In this case, an insulating material is used as the thermal transfer member 19. As the insulating material, for example, the following can be used: an epoxy-type resin, an acrylic-type resin, a silicon-type resin, an Araldite®-type resin, a high thermally conductive resin in which metal particles are mixed in the above resins, etc. When the thermal transfer member 19 contains a resin as a main component, the main component means that its resin component is the largest content, or the content of resin component is more than 50% by weight.

In one embodiment, the thermal transfer member 19 is a material which can bond the substrate 11 and the chip thermistor 13. Since this material firmly bonds the chip thermistor 13 to the substrate 11, durability increases further. Examples of this kind of material are epoxy-type, acrylic-type, silicon-type, and Araldite®-type resins, which are ultraviolet curable and/or heat curable.

As shown in FIG. 5, the solder 17 has a slanted outside surface 17b and a slanted inside surface 17a. Therefore, a recess is formed by the inside surface 17a of the solder 17 and a bottom surface 13a of the chip thermistor 13. Since a part 19a of the thermal transfer member 19 is inserted into the recess, an anchor effect is obtained. Because of this, the chip thermistor 13 is bonded more firmly to the substrate 11 by the thermal transfer member 19.

Figure 6:
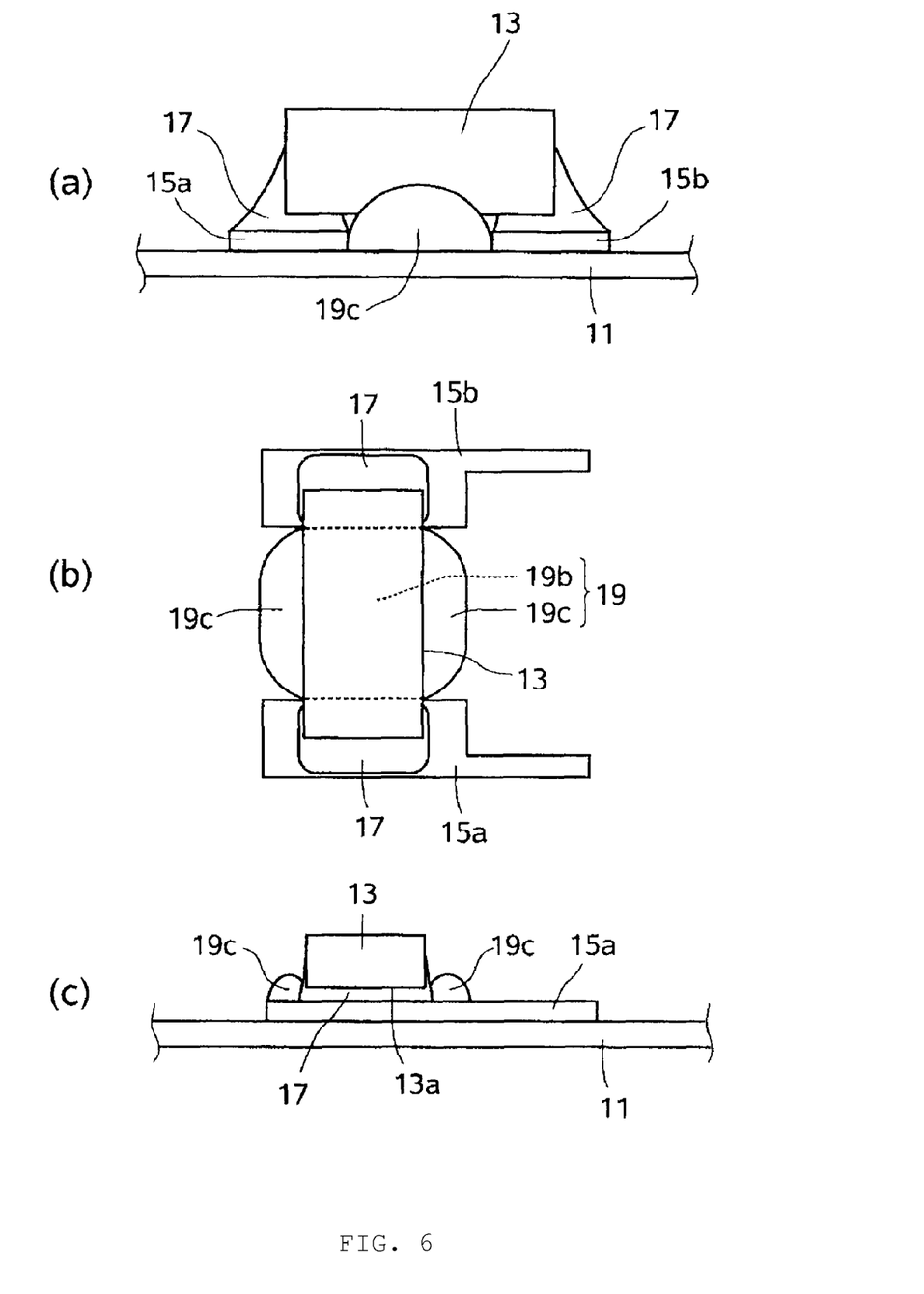
FIG. 6a to 6c are enlarged side, top plan, and end views, respectively, showing an area near a temperature detector in a thermoelectric module in accordance with a fourth embodiment.

FIG. 6 shows a fourth embodiment of the thermoelectric module.

In this embodiment, items different from those of the above mentioned first embodiment will be described in detail. Regarding the same constituent elements as those of the first embodiment, redundant explanations are omitted, and like reference numerals are used for like elements.

In the thermoelectric module of this embodiment, as shown in FIGS. 6(*a*) to 6(*c*), the thermal transfer member 19 includes a covered part 19b which is covered by a bottom surface 13a of a temperature detector 13 and extended parts 19c which extend out from the covered part 19b and are not covered by the temperature detector 13. When the thermal transfer member 19 is an ultraviolet curable bonding material, by forming the extended parts 19c so that the bonding material protrudes from the chip thermistor 13, ultraviolet radiation curing of the extended parts 19c is accelerated in the above-mentioned curing process.

In addition, in one embodiment, the extended parts 19c are thicker than the covered part 19b as shown in FIG. 6(*c*). By using this structure, the extended parts 19c can restrict a lateral move (left-right move in FIG. 6(*c*)) of the chip thermistor 13. Therefore, the chip thermistor 13 can be more securely bonded.

Further, the extended parts 19c in this embodiment are harder than the covered part 19b. This feature can increase the restriction effect for the movement of the thermistor 13.

As a method for making the extended parts 19c harder than the covered part 19b, for example, there is a method which uses a heat curable in addition to ultraviolet curable bonding material as the thermal transfer member 19, as mentioned above. According to the above-mentioned manufacturing method, since an ultraviolet irradiation amount of the extended part 19c is greater than that of the covered part 19b, curing of the extended part 19c progresses faster than that of the covered part 19b. Therefore the extended part can be hardened relatively more.

Figure 7:
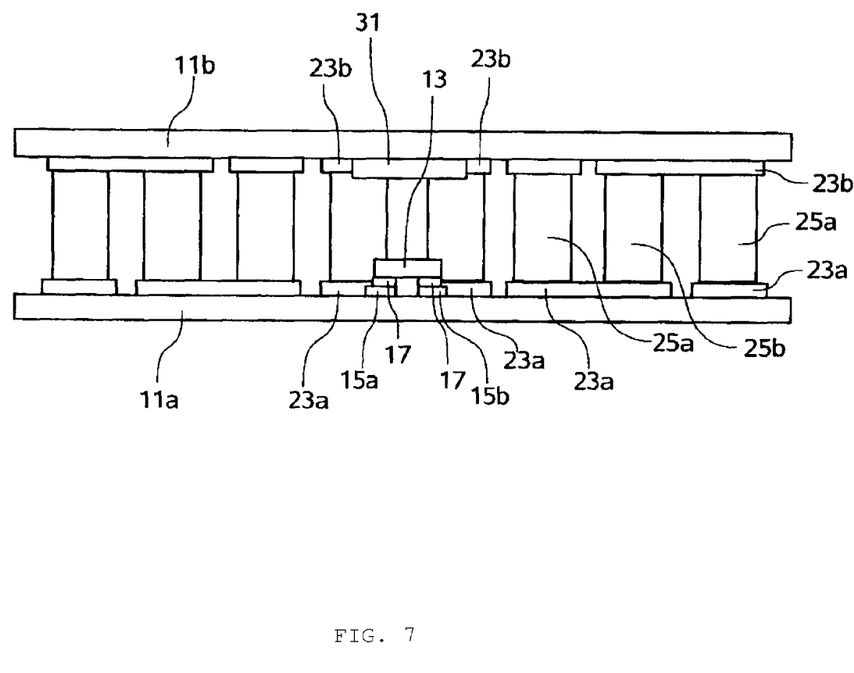
FIG. 7 is a side view showing a thermoelectric module in accordance with a fifth embodiment.
Figure 8:
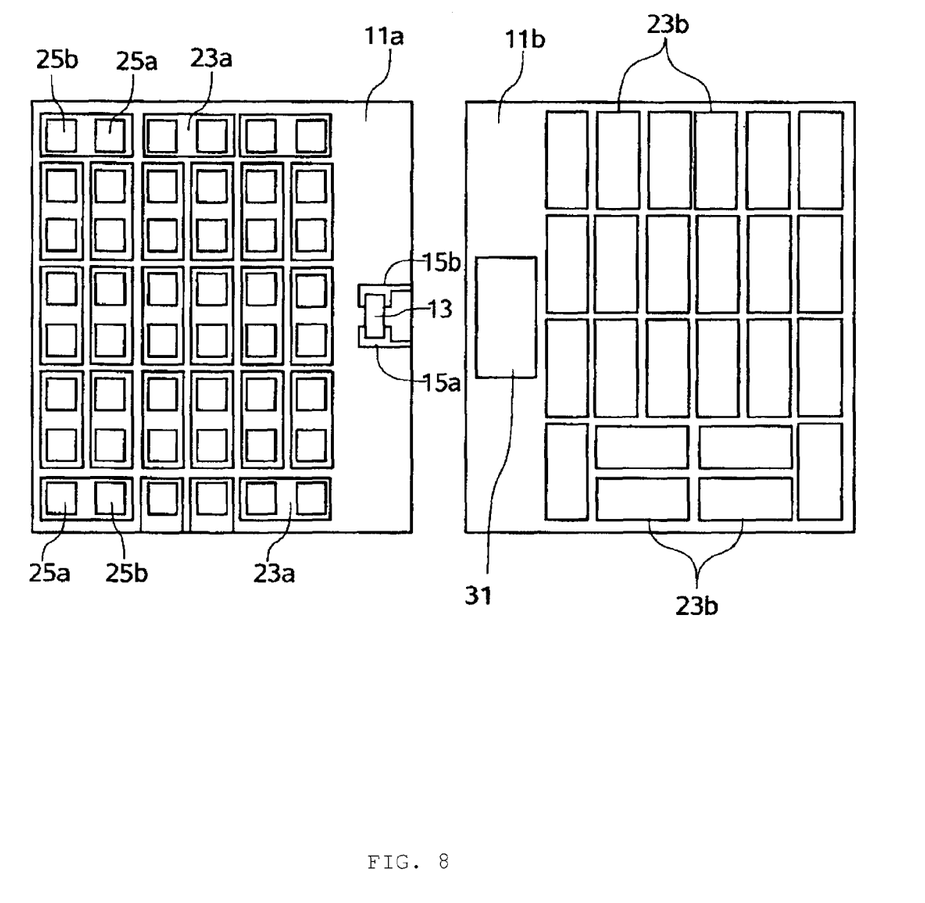
FIG. 8 is a plan view showing the thermoelectric module shown in FIG. 7 after separating one substrate from the other substrate.
Figure 9:
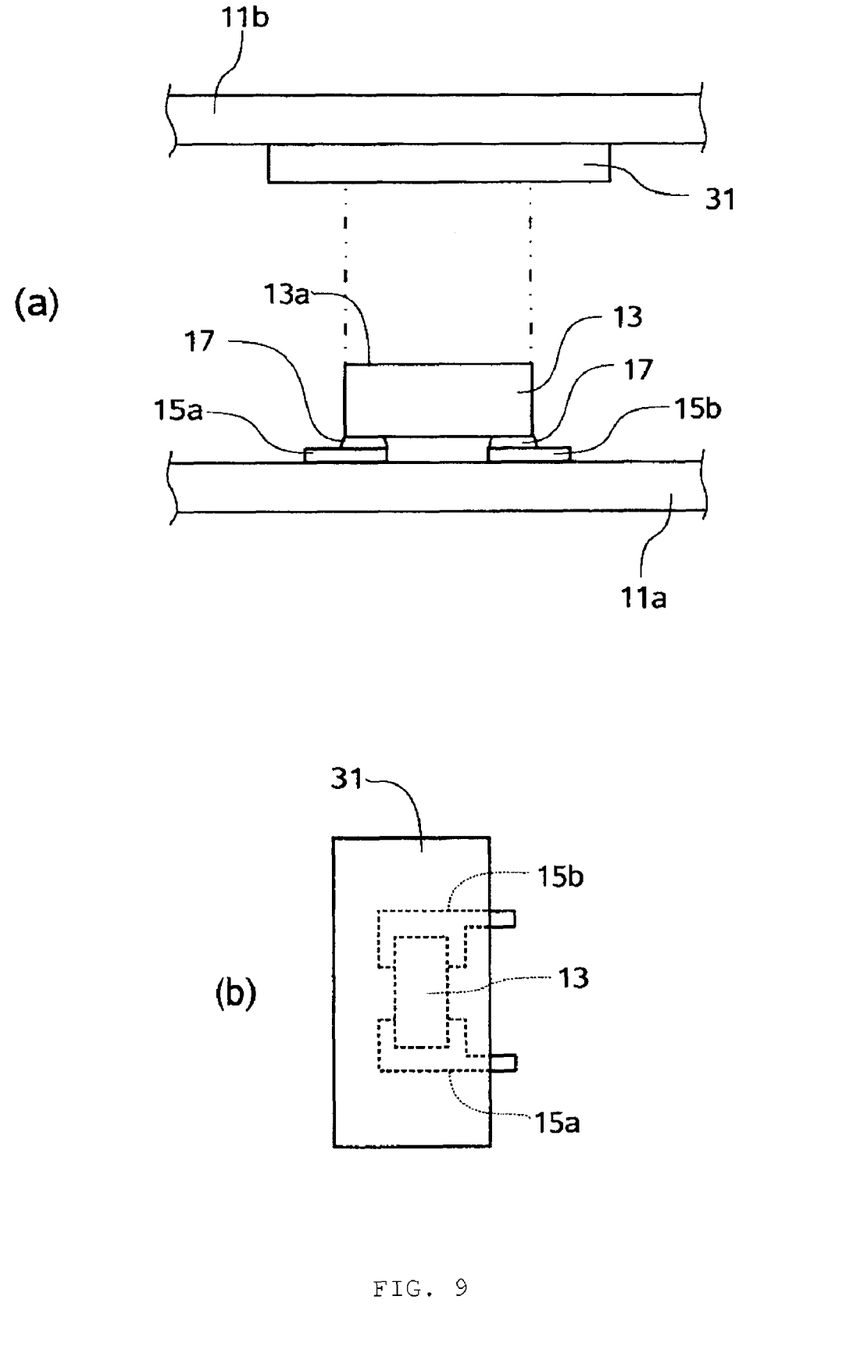
FIG. 9A is an enlarged side view showing an area near a temperature detector and a thermal transfer layer in the thermoelectric module shown in FIG. 7.
FIG. 9B is a plan view illustrating a positional relationship between the temperature detector and the thermal transfer layer.

FIGS. 7 to 9 show a fifth embodiment of a thermoelectric module.

In this embodiment, items different from those of the above mentioned first embodiment will be described in detail. Regarding the same constituent elements as those of the first embodiment, redundant explanations are omitted, and like reference numerals are used for like elements.

As shown in FIGS. 7 and 8, the thermoelectric module of this embodiment includes: a pair of substrates 11a and 11b arranged facing each other; and a plurality of P-type thermoelectric elements 25a and a plurality of N-type thermoelectric elements 25b aligned between two main surfaces facing each other in the pair of substrates 11a and 11b. On the substrate 11a and the substrate 11b, a plurality of electrodes 23a and a plurality of electrodes 23b are aligned respectively in order to connect in series the P-type thermoelectric elements 25a and the N-type thermoelectric elements 25b. This thermoelectric module includes a chip thermistor (temperature detector) 13 which is bonded to the main surface of the substrate 11a by solder 17 via electrodes 15a and 15b. Although the thermoelectric module of this embodiment does not include the thermal transfer member 19 of the first embodiment, the thermal transfer member 19 may be included.

A thermal transfer layer 31 having a thermal conductivity higher than that of the substrate 11b is placed in a position facing the chip thermistor 13, on the main surface of the substrate 11b. In one embodiment, the thermal transfer layer 31 is placed apart from the chip thermistor 13. In case temperature increases excessively while using the thermoelectric module, the temperatures of substrates 11a and 11b, electrodes 23a and 23b, P-type thermoelectric elements 25a, N-type thermoelectric elements 25b, etc. increase, and the temperature of the space between the substrate 11a and the substrate 11b increases. The chip thermistor 13 detects the temperature increase to control an electric current to the thermoelectric module. Therefore, an abnormal temperature increase can be suppressed.

In the thermoelectric module of this embodiment, since the thermal transfer layer 31 is placed in a position facing the chip thermistor 13, when the temperature of the substrate 11b on which the thermal transfer layer 31 is placed increases excessively and when the temperature of the electrodes 23b arranged near the thermal transfer layer 31 increases excessively, the temperatures are quickly transferred to the chip thermistor 13 as a radiation heat from the thermal transfer layer 31, a conductive heat via air, and a convection heat by air convection. Since this improves detection speed of the temperature detector, reliability of the thermoelectric module can be improved.

Material of the thermal transfer layer 31 is not limited if the material has a thermal conductivity higher than that of the substrate 11b. For example, suitable material for the thermal transfer layer 31 includes metals such as copper, aluminum, silver, gold, platinum, nickel, zinc, and tin, and an alloy including these metals.

Next, as shown in FIGS. 9A and 9B, the area of the main surface of the thermal transfer layer 31 may be larger than the area of the surface 13a of the chip thermistor 13 which faces the substrate 11b. The thermal transfer layer 31 is arranged covering the surface 13a which faces the opposite side substrate 11b from the chip thermistor 13. More specifically, the size and placement position of the thermal transfer layer 31 are set so that when projecting the surface 13a of the chip thermistor 13 to the substrate 11b in a vertical direction to the main surface of the substrate 11b, the thermal transfer layer 31 includes the projected figure. Based on this, heat from the thermal transfer layer 31 is more easily transferred to the chip thermistor 13.

In addition, the main surface of the thermal transfer layer 31 may be a rough surface which has small irregularities. In this case, it is possible to increase the radiation heat radiated from the main surface of the thermal transfer layer 31, by increasing the surface area of the main surface of the thermal transfer layer 31. The main surface of the thermal transfer layer 31 may also be a concave surface relative to the chip thermistor 13. In this case, the radiation heat radiated from the main surface of the thermal transfer layer 31 is easily collected by the chip thermistor 13. Furthermore, when the main surface of the thermal transfer layer 31 is a concave surface to the chip thermistor 13, if the concave surface is a partial spherical surface whose focal point is near the surface 13a of the chip thermistor 13, or a partial spheroid whose focal point is near the surface 13a, the radiation heat radiated from the main surface of the thermal transfer layer 31 is more easily collected by the chip thermistor 13.

In addition, although the thickness of the thermal transfer layer 31 is not limited, in one embodiment this thickness may be equal to or larger than the thickness of the electrodes 23b. In particular, when the thermal transfer layer 31 has the same thickness as that of the electrodes 23b and is made of the same material as that of the electrodes 23b, the electrodes 23b and the thermal transfer layer 31 can be formed at the same time. Therefore, the manufacturing cost can be reduced. When employing a thermal transfer layer 31 whose thickness is larger than that of the electrodes 23b, the distance between the thermal transfer layer 31 and the surface 13a of the chip thermistor 13 decreases. Because of this, the heat of the substrate 11b can be more easily transferred to the chip thermistor 13 through the thermal transfer layer 31. Therefore, the detection speed is further improved. To transfer the heat of the substrate 11b more easily, it is possible to place the thermal transfer layer 31 so that the thermal transfer layer 31 comes into contact with the surface 13a of the chip thermistor 13.

Figure 10:
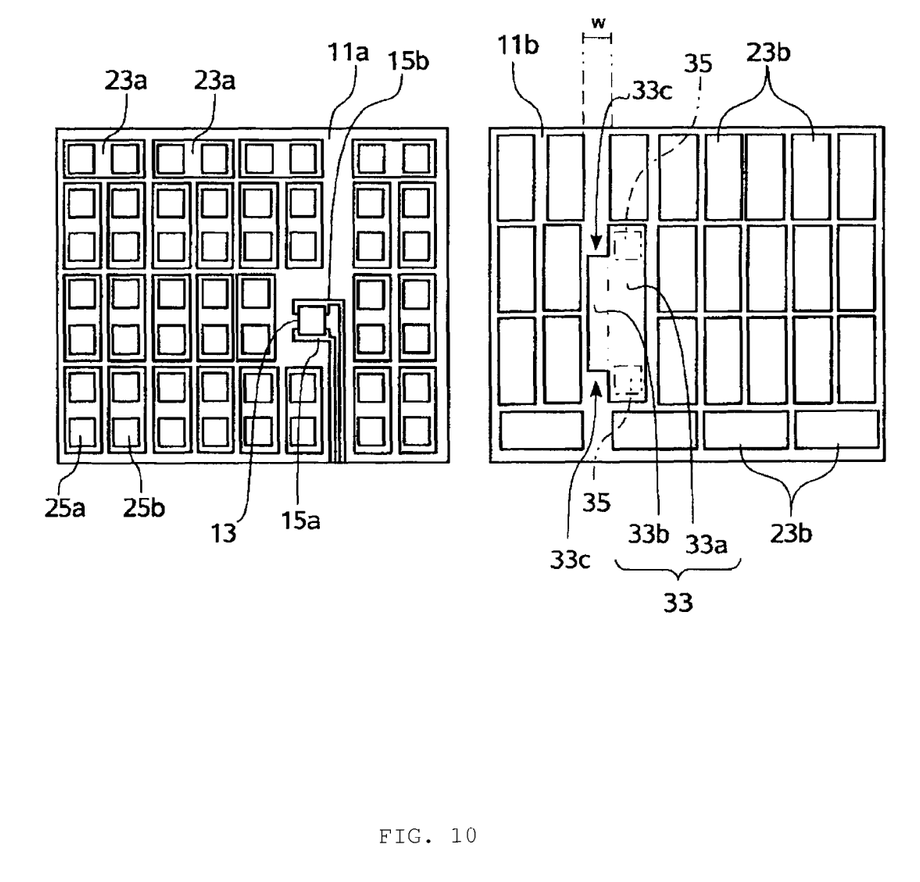
FIG. 10 is a plan view showing a thermoelectric module in accordance with a sixth embodiment after separating one substrate from the other substrate.

FIG. 10 shows a sixth embodiment of the thermoelectric module.

In this embodiment, items different from those of the above mentioned fifth embodiment will be described in detail. Regarding the same constituent elements as those of the fifth embodiment, redundant explanations are omitted, and like reference numerals are used for like elements.

In the thermoelectric module of this embodiment, the chip thermistor 13 is placed near the center of the substrate 11b. In a position facing the chip thermistor 13, a thermal transfer layer 33 is placed.

This thermal transfer layer 33 has not only the above mentioned heat transfer function but also functions as electrodes for electrically connecting the P-type thermoelectric elements 25a and N-type thermoelectric elements 25b. The thermal transfer layer 33 has an electrode part 33a for performing the function of an electrode and an extended part 33b extended from the electrode part 33a for covering the surface 13a, which faces the substrate 11b, of the chip thermistor 13. By having the extended part 33b, the thermal transfer layer 33 has an area for covering the surface 13a of the chip thermistor 13 which faces the opposite side substrate 11b.

A longitudinal length of the extended part 33b is shorter than that of the electrode part 33a. The thermal transfer layer 33 has recesses 33c along the electrode part 33a and at both longitudinal ends of the extended part 33b. These recesses 33c are areas next to areas 35 in which a P-type thermoelectric element 25a and an N-type thermoelectric element 25b are arranged respectively. By making the recesses 33c in this manner, the areas 35 in which the P-type thermoelectric element 25a and the N-type thermoelectric element 25b are arranged can be set to a necessity minimum. In this way, displacement of the P-type thermoelectric element 25a and the N-type thermoelectric element 25b can be restrained when bonding the P-type thermoelectric element 25a and the N-type thermoelectric element 25b to the electrode part 33a.

In addition, by placing the chip thermistor 13, distance w between the neighboring electrodes on the substrate 11b becomes larger than the distance between other electrodes. Strength of the substrate 11b in an area whose length (area) in which no electrode is formed is large tends to be weak compared with other areas in the substrate 11b. By placing the extended part 33b between the electrodes which are apart by the distance w, a decrease of the strength of the substrate 11b can be controlled.

A method for manufacturing a thermoelectric module is now described by using an example of manufacturing a thermoelectric module of the second embodiment shown in FIG. 4.

Figure 11:
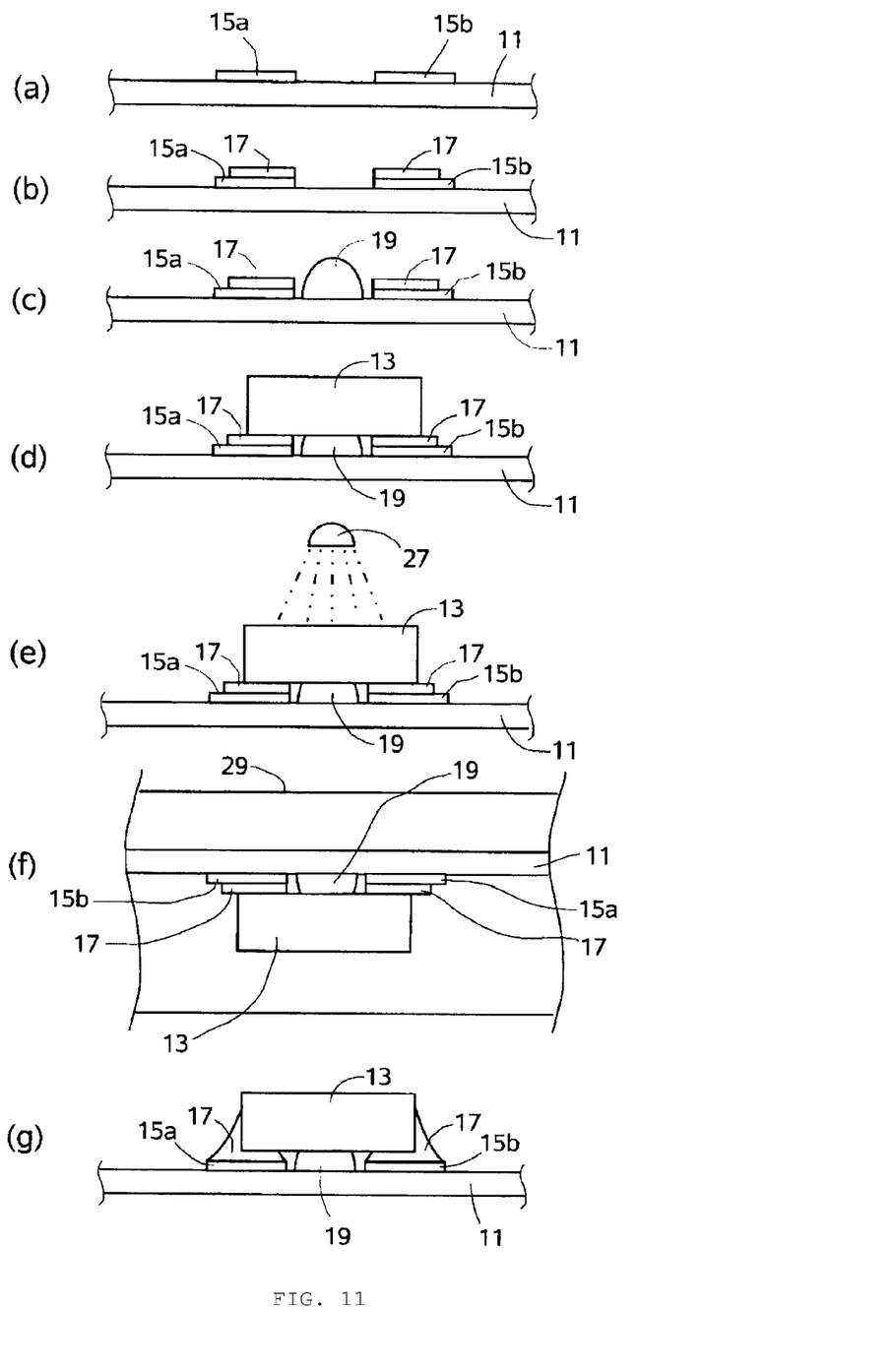
FIGS. 11A to 11G are process drawings showing one embodiment of a method for manufacturing the thermoelectric module.

First, the electrodes 15a and 15b are formed on the main surface of the substrate 11 (FIG. 11A). An electrode pattern can be formed on the surface of the substrate by etching, etc.

Next, the solders 17 are placed on electrodes 15a and 15b respectively (FIG. 11B).

Next, a predetermined amount of an ultraviolet curable or heat curable bonding resin (thermal transfer member) 19 is placed on the main surface of the substrate 11 (FIG. 11C). As an ultraviolet curable bonding resin 19, for example, an epoxy-type ultraviolet curable adhesive can be used.

Next, the chip thermistor 13 is placed on the main surface of the substrate 11 via the solders 17 and the bonding resin 19 using a chip mounter, etc. (FIG. 11D). In this operation, the bonding resin 19 may be mounted so that the bonding resin 19 protrudes a little from the chip thermistor for a curing process mentioned below.

Next, the bonding resin 19 is irradiated by ultraviolet rays using an ultraviolet lamp 27 (FIG. 11E). Although the ultraviolet lamp 27 is positioned over the chip thermistor 13 in FIG. 11E, the ultraviolet lamp 27 may be positioned at the side of the chip thermistor 13. When irradiating ultraviolet rays to the bonding resin 19, the bonding resin 19 reacts and the chip thermistor 13 is bonded to the main surface of the substrate 11. In this operation, a cross-linking reaction of the bonding resin 19 does not need to proceed completely, and it is possible that the reaction proceeds to a level in which the chip thermistor 13 is temporarily bonded to the main surface of the substrate 11. In one embodiment of the method, the bonding resin 19 protrudes from the chip thermistor 13 because this accelerates curing of the resin by the ultraviolet irradiation. When using a heat curable bonding resin, a heat temperature which does not affect the solder is selected, and the heat is irradiated to cure the bonding resin 19.

Next, the substrate 11 is placed upside down in a heating machine 29, and is heated (FIG. 11F). More specifically, the solders 17 and the bonding resin 19 are heated while the chip thermistor 13 is positioned under the substrate 11. A heating temperature and a heating time can be properly set according to material conditions, etc. of the solders 17 and the bonding resin 19. In this manner, by heating the substrate 11 upside down, the solders 17 can flow effectively to the sides of the chip thermistor 13. Since this operation increases the bonding areas between the solders 17 and the surface of the chip thermistor 13, the chip thermistor 13 is more firmly bonded to the main surface of the substrate 11.

The bonding resin 19 may be not only ultraviolet curable but also heat curable at the same time. This feature extends progress of the reaction of the bonding resin 19 even during the heating process, and the chip thermistor 13 is more firmly bonded to the main surface of the substrate 11. It is possible that the cross-linking reaction is not completed in the ultraviolet irradiation process. Since the bonding resin 19 is heat curable in addition to ultraviolet curable, the cross-linking reaction also proceeds in the heating process. These processes not only can reduce residual stress in the bonding resin 19 after the heating process, but also can completely evaporate organic constituents included in the bonding material at the same time.

As described above, the thermoelectric module is manufactured (FIG. 11G).

The present invention is not limited to the contents of each embodiment described above, and various modifications can be added without departing from the scope of the invention. Examples of modifications are described below.

As a main component of the solder 17, for example, there is a lead-free type solder material such as SnSb, SnAgCu, AuSn, and SnBi. As a substrate 11, for example, the following can be used: a ceramic such as alumina and aluminum nitride; a resin substrate such as epoxy or polyimide; and a substrate in which ceramic fillers are added to an epoxy and/or polyimide resin to improve thermal conduction. When using the bonding resin 19, a resin material may be used for the substrate 11. This further increases the bonding strength.

The substrate 11 may be marginally sealed around its edges by a sealing material. This sealing can suppress dew condensation on a circuit of the thermoelectric module. A low hardness adhesive may be used as a sealing material, such as a silicone adhesive, which is soft in hardness and has elasticity. When using a low hardness adhesive as a sealing material, it is possible to reduce thermal stress generated between a high temperature side support substrate and a low temperature side support substrate. As a low hardness sealing material, there is a material whose main component is a silicon type material, and as a high hardness seal material, there is a material whose main component is an epoxy type material.

In other embodiments, the temperature detector may be a thermocouple, a resistor bulb, a thermoswitch, or the like, rather than the chip thermistor 13. However, the chip thermistor 13 is easy to use because it is an element whose electrical resistance varies depending on temperature and it has no wiring. Furthermore, since the chip thermistor 13 is compact and its heat capacity can be small, it is possible to reduce the effect on endothermic and exothermic performances even when the chip thermistor 13 is used in a thermoelectric module whose endothermic amount is small.

Although only one temperature detector is depicted in each figure, a plurality of temperature detectors may be mounted on internal surfaces of the substrate 11 in other embodiments. By using the above structure, it becomes possible to detect a local temperature change and measure an average temperature.

The above mentioned thermoelectric module can be used as a heat exchange apparatus, for example, by mounting a heat exchanger on an external surface of at least one of the substrates 11 of the thermoelectric module. The heat exchanger has a fluid flow path in which a refrigerant fluid flows, and the heat exchanger lets the fluid flow in a predetermined direction to perform a heat exchange. When the heat exchanger is mounted on one of the substrates 11, it is possible to control temperature by placing an object to be cooled or temperature-controlled on the other substrate 11. The heat exchanger can be mounted on both sides of the pair of substrates 11. Specifically, when mounting a wave-shaped fin, for example, as a heat exchanger on both sides of the thermoelectric module, and turning on the thermoelectric module while making sideways air flow, a cool wind is generated on one side and a warm wind is generated on the other side. In a cooling system which uses the cool wind, when mounting a temperature detector at a fluid exit on the substrate 11, it becomes possible to measure accurately the temperature of the cooled wind. Therefore, temperature-control of the wind becomes easy.

The thermoelectric module of each embodiment mentioned above can be mounted on an electric generator as an electric generation means.

Also, the thermoelectric module of each embodiment mentioned above can be mounted on a temperature-control device as a temperature-control means. As the temperature-control device, for example, there is a cooling device which uses the thermoelectric module as cooling means and a heating device which uses the thermoelectric module as a heating means.

EXAMPLES

Further details of the present invention will be described based on examples. However, the present invention is not limited to the following examples.

In one example, wiring substrates which include a wiring pattern (electrodes) on which 127 pairs of thermoelectric elements are arranged were prepared. The wiring substrate includes an insulating substrate whose main component is an epoxy resin and a conductive layer whose main component is copper. Lead-free solder paste such as Sn—Sb system, Sn—Ag—Cu system, Au—Sn system, and Sn—Bi system was screen-printed on the electrodes of the wiring substrate to form a solder pattern.

Next, various adhesives which have various curing characteristics were applied between the electrodes on which a chip thermistor is mounted while changing the amount of application through a dispense method. After the application, the chip thermistor was mounted by a mounter. Subsequently, the chip thermistor was temporarily fixed by irradiating ultraviolet rays and/or blowing warm air of 80° C. from above the substrate as a curing method.

Next, P-type thermoelectric elements and N-type thermoelectric elements were mounted on the solder pattern. Next, a wiring substrate was put on the thermoelectric elements as a covering of the thermoelectric elements to obtain a module. Subsequently, the module was turned upside down, and reflow-heated while the chip thermistor was placed on the upside substrate. By doing so, the solder was melted and soldering was performed.

One hundred modules were made per each kind of module. Thermistor resistance was measured for each module. Yield rates were measured by counting the number of defective modules in which the thermistor was dropped and the thermistor resistance could not measured. Further, the obtained substrates in which mount elements were partially disassembled, and the thicknesses of the covered part which is covered by the thermistor and the extended part which is not covered by the thermistor were compared by observing cross-sectional surfaces of the thermistor and the resin. As the thickness of the extended part, an average of heights which contact the thermistor was obtained. As for degree of hardness, Shore A hardness of each member was measured by the method specified in JIS K 6253. After performing 120 cycles of the temperature cycle test which is from −40° C. to +125° C. and 30 minutes per cycle, the thermistor resistances were measured again, and also the same yield rates as mentioned above were evaluated. Furthermore, response performance was evaluated by applying a voltage of 10 V to the thermoelectric module and measuring the thermistor resistance, more specifically measuring the time until the measured temperature indicates a certain value. The results are shown in Table 1 below.

TABLE 1

| | | | Condition of adhesive | | | | Yield rate (%) | | |
| --- | --- | --- | --- | --- | --- | --- | --- | --- | --- |
| | | | Thickness (μm) | | Hardness (Shore A) | | | After | Response |
| No. | Type of adhesive | Curing method | Covered part | Expanded part | Covered part | Expanded part | After manufacturing | endurance cycle | speed (seconds) |
| 1 | None | None | — | — | — | — | 52 | 83 | 10 |
| 2 | B | Ultraviolet | 80 | 150 | 60 | 70 | 100 | 97 | 6 |
| 3 | C | Ultraviolet | 80 | 170 | 60 | 75 | 100 | 97 | 6 |
| 4 | A | Hot air | 80 | 160 | 60 | 70 | 100 | 97 | 6 |
| 5 | C | Hot air | 80 | 100 | 55 | 70 | 100 | 97 | 7 |
| 6 | C | Ultraviolet | 80 | 240 | 60 | 75 | 100 | 98 | 6 |
| 7 | C | Ultraviolet | 80 | 400 | 60 | 75 | 100 | 98 | 6 |
| 8 | C | Ultraviolet | 80 | 560 | 60 | 75 | 100 | 99 | 6 |
| 9 | C | Ultraviolet + Hot air | 80 | 560 | 70 | 80 | 100 | 100 | 4 |

A: Heat curable resin
B: Ultraviolet curable resin
C: Heat and UV curable resin

As shown in Table 1, the sample No. 1, which was not bonded temporarily, showed the results of low yield rates, lower durability compared with the other samples, and furthermore low response speed.

On the other hand, the samples No. 2 to 9 showed the results of high yield rates and high durability. The response speeds also showed values higher than that of the sample No. 1.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The invention claimed is:

1. A thermoelectric module comprising:
a first substrate having a first surface;
a second substrate having a second surface facing the first surface of the first substrate, the second surface being apart from the first surface by a certain distance;
a plurality of thermoelectric elements arranged on the first surface and the second surface;
a temperature detector on the first surface of the first substrate; and
a thermal transfer layer which is on the second surface of the second substrate and faces the temperature detector, the thermal transfer layer having a thermal conductivity higher than that of the second substrate;
a plurality of electrodes arranged on the first surface or the second surface and electrically connected to at least one of the plurality of thermoelectric elements, the thermal transfer layer being constituted as one of the plurality of electrodes,
wherein the thermal transfer layer has a T-shaped configuration including an electrode part which is connected to at least one of the plurality of thermoelectric elements and directly interfaces the thermoelectric elements; and an extended part which is other than the electrode part and faces the temperature detector and does not interface the thermoelectric elements; wherein a length of the electrode part is longer than that of the extended part in a longitudinal direction of the thermal transfer layer.

2. The thermoelectric module according to claim 1, wherein the thermal transfer layer is spaced from the temperature detector, and the area of the thermal transfer layer is larger than the surface area of the temperature detector which faces the second substrate.

3. The thermoelectric module according to claim 1, further comprising a thermal transfer member between the temperature detector and the first surface.

4. The thermoelectric module according to claim 3, wherein the thermal transfer member comprises a resin as a main component.

5. The thermoelectric module according to claim 3, wherein the thermal transfer member comprises;

a covered part which is covered by the temperature detector; and
an extended part which is extended from the covered part and is not covered by the temperature detector.

6. The thermoelectric module according to claim 5, wherein the extended part is thicker than the covered part.

7. The thermoelectric module according to claim 5, wherein the extended part is harder than the covered part.

8. The thermoelectric module according to claim 4, wherein the resin comprises at least one of an ultraviolet curable resin and a heat curable resin.

9. A thermoelectric module comprising:
a first substrate having a first surface;
a second substrate having a second surface facing the first surface of the first substrate, the second surface being apart from the first surface by a certain distance;
a plurality of P-type thermoelectric elements arranged on the first surface and the second surface;
a plurality of N-type thermoelectric elements arranged on the first surface and the second surface;
a temperature detector on the first surface of the first substrate;
a plurality of electrodes aligned respectively, on the first substrate and the second substrate, in order to connect in series the P-type thermoelectric elements and the N-type thermoelectric elements; and
a thermal transfer layer which is on the second surface of the second substrate and faces the temperature detector, the thermal transfer layer having a thermal conductivity higher than that of the second substrate and being constituted as one of the plurality of electrodes,
wherein the thermal transfer layer has a T-shaped configuration including an electrode part which is connected to at least one of the plurality of thermoelectric elements and directly interfaces the thermoelectric elements; and an extended part which is other than the electrode part and faces the temperature detector, and does not interface the thermoelectric elements; wherein a length of the electrode part is longer than that of the extended part in a longitudinal direction of the thermal transfer layer.

10. The thermoelectric module according to claim 9, wherein the thermal transfer layer is spaced from the temperature detector, and the area of the thermal transfer layer is larger than the surface area of the temperature detector which faces the second substrate.

11. The thermoelectric module according to claim 9, further comprising a thermal transfer member between the temperature detector and the first surface.

12. The thermoelectric module according to claim 11, wherein the thermal transfer member comprises a resin as a main component.

13. The thermoelectric module according to claim 11, wherein the thermal transfer member comprises;
a covered part which is covered by the temperature detector; and
an extended part which is extended from the covered part and is not covered by the temperature detector.

14. The thermoelectric module according to claim 13, wherein the extended part is thicker than the covered part.

15. The thermoelectric module according to claim 13, wherein the extended part is harder than the covered part.

16. The thermoelectric module according to claim 12, wherein the resin comprises at least one of an ultraviolet curable resin and a heat curable resin.

* * * * *